US009732422B2

(12) United States Patent
She et al.

(10) Patent No.: US 9,732,422 B2
(45) Date of Patent: *Aug. 15, 2017

(54) METHOD OF COATING METALLIC POWDER PARTICLES

(71) Applicant: United Technologies Corporation, Hartford, CT (US)

(72) Inventors: Ying She, East Hartford, CT (US); James T. Beals, West Hartford, CT (US)

(73) Assignee: United Technologies Corporation, Farmington, CT (US)

( * ) Notice: Subject to any disclaimer, the term of this patent is extended or adjusted under 35 U.S.C. 154(b) by 191 days.

This patent is subject to a terminal disclaimer.

(21) Appl. No.: 14/604,470

(22) Filed: Jan. 23, 2015

(65) Prior Publication Data

US 2016/0215390 A1    Jul. 28, 2016

(51) Int. Cl.

| C23C 16/44 | (2006.01) |
|---|---|
| B22F 1/02 | (2006.01) |
| C23C 16/442 | (2006.01) |
| C23C 16/22 | (2006.01) |
| C23C 16/01 | (2006.01) |
| B05D 1/22 | (2006.01) |
| B01J 2/04 | (2006.01) |
| B01J 8/24 | (2006.01) |
| B22F 3/105 | (2006.01) |
| C23C 16/24 | (2006.01) |
| B33Y 70/00 | (2015.01) |
| B33Y 40/00 | (2015.01) |

(Continued)

(52) U.S. Cl.
CPC ............. *C23C 16/4417* (2013.01); *B01J 2/04* (2013.01); *B01J 8/24* (2013.01); *B05D 1/22* (2013.01); *B22F 1/02* (2013.01); *B22F 3/1055* (2013.01); *C23C 16/01* (2013.01); *C23C 16/22* (2013.01); *C23C 16/24* (2013.01); *C23C 16/442* (2013.01); *B22F 2201/00* (2013.01); *B22F 2998/00* (2013.01); *B33Y 40/00* (2014.12); *B33Y 70/00* (2014.12); *C23C 16/4481* (2013.01); *C23C 16/45561* (2013.01); *Y02P 10/295* (2015.11)

(58) Field of Classification Search
CPC combination set(s) only.
See application file for complete search history.

(56) References Cited

U.S. PATENT DOCUMENTS

| 4,564,532 A | 1/1986 | Henderson |
|---|---|---|
| 4,746,547 A | 5/1988 | Brown et al. |

(Continued)

FOREIGN PATENT DOCUMENTS

| CN | 103060770 A | 4/2013 |
|---|---|---|
| WO | 2014176045 | 10/2014 |

OTHER PUBLICATIONS

EP search report for EP16152528.2 dated Jul. 1, 2016.

*Primary Examiner* — Erma Cameron
(74) *Attorney, Agent, or Firm* — O'Shea Getz P.C.

(57) ABSTRACT

A method and system for coating metallic powder particles is provided. The method includes: disposing an amount of metallic powder particulates within a fluidizing reactor; removing moisture adhered to the powder particles disposed within the reactor using a working gas; coating the powder particles disposed within the reactor using a precursor gas; and purging the precursor gas from the reactor using the working gas.

12 Claims, 2 Drawing Sheets

(51) Int. Cl.
  *C23C 16/448* (2006.01)
  *C23C 16/455* (2006.01)

(56) References Cited

U.S. PATENT DOCUMENTS

| | | | |
|---|---|---|---|
| 4,980,202 A | | 12/1990 | Brennan et al. |
| 5,474,605 A | * | 12/1995 | Schmid ................ C09C 1/62 106/31.9 |
| 5,749,041 A | * | 5/1998 | Lakshminarayan .. B22F 3/1055 419/2 |
| 6,039,894 A | | 3/2000 | Sanjurjo et al. |
| 6,152,987 A | | 11/2000 | Ma et al. |
| 6,171,649 B1 | * | 1/2001 | Keener ................... B05D 1/00 427/213 |
| 7,166,263 B2 | | 1/2007 | Vanderspurt et al. |
| 7,575,039 B2 | | 8/2009 | Beals et al. |
| 7,612,011 B2 | | 11/2009 | Vanderspurt et al. |
| 7,989,078 B2 | | 8/2011 | Jaworowski et al. |
| 8,110,295 B2 | | 2/2012 | Jaworowski et al. |
| 8,216,536 B2 | | 7/2012 | McMillen |
| 8,257,510 B2 | | 9/2012 | Jaworowski et al. |
| 8,283,044 B2 | | 10/2012 | Jaworowski et al. |
| 8,529,844 B2 | | 9/2013 | Ishii et al. |
| 2005/0281701 A1 | * | 12/2005 | Lynch ..................... B22F 3/22 419/10 |
| 2006/0251535 A1 | * | 11/2006 | Pfeifer .................... B22F 1/02 419/36 |
| 2006/0251826 A1 | * | 11/2006 | Pfeifer .................... B01J 2/006 427/558 |
| 2006/0275167 A1 | | 12/2006 | Ott et al. |
| 2010/0009080 A1 | | 1/2010 | Jan Snijders et al. |

* cited by examiner

METHOD OF COATING METALLIC POWDER PARTICLES

BACKGROUND OF THE INVENTION

1. Technical Field

The present disclosure relates to processing metallic powder particles in general, and to processes for coating metallic powder particles in particular.

2. Background Information

Aluminum alloy materials are widely used in many areas including the aerospace industry for their light weight structural properties and in heat transfer products due to high thermal conductivity. Additive manufacturing of aluminum alloy powders, in particular, via laser based additive processes, has drawn increasing attention. A significant challenge in the laser additive manufacturing of certain alloy powders (e.g., certain aluminum alloy powders) is the high degree to which energy in the form of light waves within a laser beam are reflected away from the alloy powder. As a result of the reflectance, the energy of the reflected light does not appreciably contribute to the additive process. In some instances, it may not be possible to sufficiently increase the intensity of existing laser equipment to overcome the reflectance issue. Even in those instances where the laser intensity can be increased, such a practice can create new detrimental issues; e.g., a higher intensity laser can overheat the powder and cause the powder particles to "ball up" and consequently create a non-uniform deposition layer. Also as a result of the reflectance, present additive manufacturing processes are sometimes limited to certain types of materials. With respect to aluminum alloys, for example, additive manufacturing processes are today typically limited to cast aluminum alloy compositions. These cast aluminum alloy compositions have low reflectance properties that allow them to be used in additive processes, but possess undesirable mechanical and thermal properties.

In addition, alloy powders adsorbed with water moisture can cause significant quality issues of the deposits made by additive manufacturing processes. These issues include porosity, cracks, and blisters.

It would be beneficial to resolve the aforesaid issues and thereby improve additive manufacturing processes and make it possible to additively manufacture certain alloy powders, including additional types of aluminum alloy compositions.

SUMMARY OF THE INVENTION

According to one aspect of the present disclosure, a method of coating metallic powder particles is provided. The method includes: disposing an amount of metallic powder particulates within a fluidizing reactor; removing moisture adhered to the powder particles disposed within the reactor using a working gas; coating the powder particles disposed within the reactor with a material present within a precursor gas; and purging the precursor gas from the reactor using the working gas.

In a further embodiment of the foregoing aspect, the coating includes coating the powder particles with the material in an amount such that the coated powder particles have a level of reflectivity that is acceptable for subsequent processing of the coated powder particles within an additive manufacturing process.

In a further embodiment of the foregoing aspect, the metallic powder particles are aluminum alloy. They may include at least one of aluminum 5056, aluminum 6061, aluminum 7075, or proprietary aluminum alloys such as Pandalloy® aluminum alloy. Pandalloy® (also referred to herein as "PANDALLOY") is a registered trademark of United Technologies Corporation.

In a further embodiment of any of the foregoing embodiments of the present disclosure, the precursor gas comprises silicon. The precursor gas may include at least one of silane ($SiH_4$), disilane ($Si_2H_6$), chlorosilane ($H_3ClSi$), or dichlorosilane ($SiH_2Cl_2$).

In a further embodiment of any of the foregoing embodiments of the present disclosure, the working gas is at least one of nitrogen ($N_2$) or reducing gas hydrogen ($H_2$).

In a further embodiment of any of the foregoing embodiments of the present disclosure, removing moisture adhered to the powder particles disposed within the reactor using working gas includes heating the working gas to a predetermined temperature.

According to another aspect of the present disclosure, a method of coating metallic powder particles is provided. The method includes: providing a system having a fluidizing reactor, a working gas source, a precursor gas source, and a processor adapted to execute instructions to control and monitor operation of the system, wherein the processor is in communication with a memory operable to store the executable instructions; disposing an amount of metallic powder particulates within a fluidizing reactor; controlling the system to remove moisture adhered to the powder particles disposed within the reactor using a working gas provided from the working gas source; controlling the system to coat the powder particles disposed within the reactor using a precursor gas provided from the precursor gas source; and controlling the system to purge the precursor gas from the reactor using the working gas.

In a further embodiment of the foregoing aspect, the step of controlling the system to coat the powder particles includes coating the powder particles with the material present in the precursor gas in an amount such that the coated powder particles have a level of reflectivity that is acceptable for subsequent processing of the coated powder particles within an additive manufacturing process.

In a further embodiment of the foregoing aspect, the metallic powder particles are aluminum alloy. The may include at least one of aluminum 5056, aluminum 6061, aluminum 7075, or PANDALLOY aluminum alloy.

In a further embodiment of any of the foregoing embodiments of the present disclosure, the precursor gas comprises silicon. The precursor gas may include at least one of silane ($SiH_4$), disilane ($Si_2H_6$), chlorosilane ($H_3ClSi$), or dichlorosilane ($SiH_2Cl_2$).

In a further embodiment of any of the foregoing embodiments of the present disclosure, the working gas is at least one of nitrogen ($N_2$) or reducing gas hydrogen ($H_2$).

In a further embodiment of any of the foregoing embodiments of the present disclosure, removing moisture adhered to the powder particles disposed within the reactor using working gas includes heating the working gas to a predetermined temperature.

In a further embodiment of any of the foregoing embodiments of the present disclosure, the memory is at least one of a non-volatile memory or a non-transitory computer readable media in communication with the processor.

In a further embodiment of any of the foregoing embodiments of the present disclosure, the method further includes cooling the coated powder particles.

According to another aspect of the present disclosure, a system for coating metallic powder particles is provided. The system includes at least one working gas source, at least one precursor gas source, at least one fluidizing reactor, and a processor. The fluidizing reactor is in communication with the working gas source and the precursor gas source. The processor is adapted to execute instructions to control operation of the system. The executable instructions are operable to control the system to: remove moisture adhered to the powder particles disposed within the reactor using working gas provided from the working gas source; coat the powder particles disposed within the reactor using a precursor gas provided from the precursor gas source; and purge the precursor gas from the reactor using the working gas.

In a further embodiment of the foregoing aspect, the executable instructions are operable to control the system to provide a mixture of the precursor gas and the working gas and to coat the powder particles disposed within the reactor using the mixture.

In a further embodiment of any of the foregoing embodiments of the present disclosure, the system further includes an escaped powder particle collector vessel.

In a further embodiment of any of the foregoing embodiments of the present disclosure, the system further includes at least one heat source, and the executable instructions are operable to control the heat source to heat the working gas to a predetermined temperature, and to remove moisture adhered to the powder particles disposed within the reactor using the working gas heated to the predetermined temperature.

In a further embodiment of any of the foregoing embodiments of the present disclosure, the system further includes a liquid bubbler disposed such that working gas and precursor gas exiting the reactor travels through the liquid bubbler.

In a further embodiment of any of the foregoing embodiments of the present disclosure, the metallic powder particles are an aluminum alloy that includes at least one of aluminum 5056, aluminum 6061, aluminum 7075, or PANDALLOY aluminum alloy, and the precursor gas includes at least one of silane ($SiH_4$), disilane ($Si_2H_6$), chlorosilane ($H_3ClSi$), or dichlorosilane ($SiH_2Cl_2$).

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
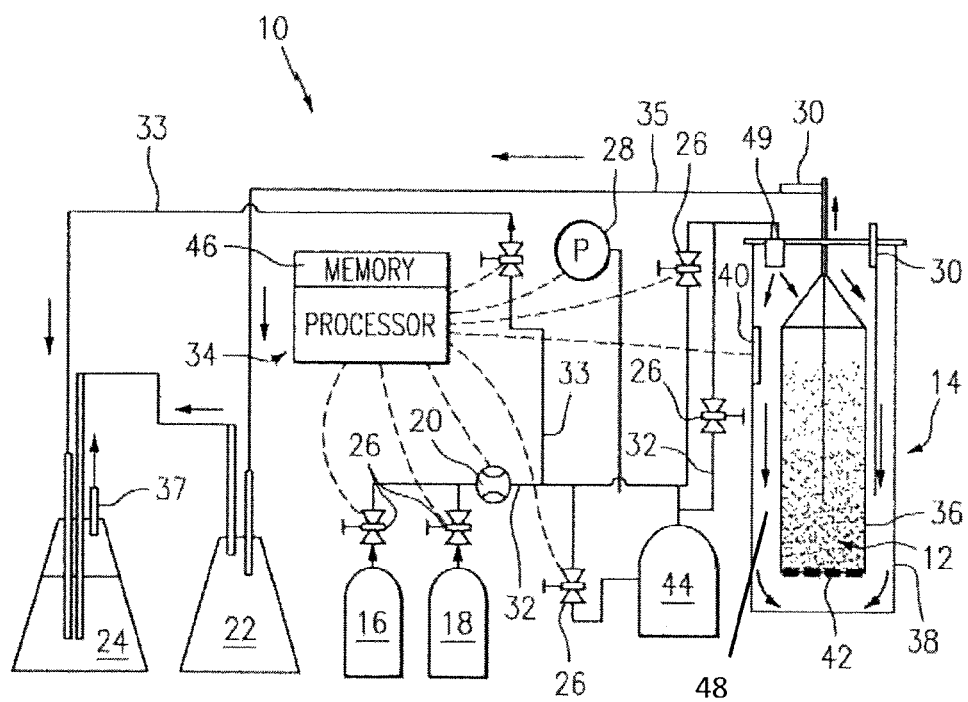
FIG. 1 is a schematic illustration of an embodiment of the present system.

It is noted that various connections are set forth between elements in the following description and in the drawings (the contents of which are included in this disclosure by way of reference). It is noted that these connections are general and, unless specified otherwise, may be direct or indirect and that this specification is not intended to be limiting in this respect. A coupling between two or more entities may refer to a direct connection or an indirect connection. An indirect connection may incorporate one or more intervening entities.

According to the present disclosure, a system 10 and method for preparing a metallic material (e.g., aluminum alloy powder) for additive manufacturing is provided. For the purpose of describing the present disclosure, the metallic material is detailed hereinafter as being an aluminum alloy powder. The present disclosure provides particular utility regarding the processing of aluminum alloy particles 12 (e.g., because of the reflectivity of aluminum alloy powders), but the applicability of the present disclosure is not limited to aluminum alloys. The term "powder" as used herein refers to matter configured in the form of fine discrete particles. The aforesaid particles 12 may assume a variety of different particle sizes; e.g., particles having a diameter in the range of about one micrometer to one hundred and fifty micrometers (i.e., 1-150 µm). The present disclosure is typically used to process particles 12 of a given size (i.e., substantially all of the particles are "x" diameter) during a particular processing application, but the present disclosure is not limited to processing particles 12 of a specific size. Non-limiting examples of aluminum alloy powders that may be processed using the present disclosure include aluminum 5056, aluminum 6061, aluminum 7075, PANDALLOY aluminum alloy, etc.

FIG. 1 illustrates a schematic illustration of an exemplary system 10 operable to prepare a metallic material for further processing; e.g., additive manufacturing. The system 10 includes a fluidized bed reactor 14, at least one working gas source 16, at least one precursor gas source 18, a mass flow control device 20, an escaped powder collector vessel 22, a liquid (e.g., water) bubbler 24, and various valves 26 and flow measuring devices (e.g., pressure gauges 28, temperature sensing devices 30, etc.) disposed within piping 32 connecting the aforesaid devices. The piping 32 may include bleed line 33, outlet lines 35, vents 37, etc. In addition, a processor 34 may be included in the system 10 in communication with one or more of the aforesaid devices, valves, and flow measuring devices to control and monitor the system 10. The aforesaid system 10 is an example of a system configuration, and the present disclosure is not limited to the specific system illustrated.

The fluidized bed reactor 14 (hereinafter referred to as the "reactor 14") may assume a variety of different configurations. For example, the reactor 14 may be configured to have a single vessel or configured to have both an inner vessel and an outer vessel. The schematic system 10 shown in FIG. 1 illustrates a reactor 14 configured with both an inner vessel 36 and an outer vessel 38. In alternative embodiments, the reactor 14 may include a plurality of independent vessels; e.g., each disposed to fluidize a different powder material. The reactor 14 may include a heat source 40 to heat a fluidizing gas (schematically depicted in FIG. 1), or a heat source may be provided independent of the reactor 14. One or more temperature sensing devices 30 (e.g., thermocouples) may be disposed inside the reactor 14 or may be disposed in the piping 32 leading to and/or from the reactor 14 to sense the temperature of the gases entering the reactor 14, the gas powder mixture within the reactor 14, the gas powder mixture exiting the reactor 14. The reactor 14 may include a distributor (e.g., a porous plate 42) through which gases are introduced into the vessel (e.g., the inner vessel 36).

The working gas source 16 provides at least one gas that is inert and/or one that creates a "reducing atmospheric environment" with respect to the processing of the particular material. The term "reducing atmospheric environment" or "reducing gas" as used herein refers to a gas that is operable to create an environment in which oxidation is prevented by removal of oxygen or other oxidizing gases or vapors. Nitrogen ($N_2$) or hydrogen ($H_2$) are non-limiting examples of gases that can be used to process aluminum alloy powders; e.g., Nitrogen ($N_2$) is a non-limiting example of an inert gas and hydrogen ($H_2$) is a non-limiting example of a reducing gas. As will be described hereinafter, the working gas may be used as a medium to heat the powder particles 12 and to remove adsorbed moisture from the powder. The working gas source 16 may assume any form (e.g., pressurized vessel, etc.) appropriate to provide the working gas as required.

The precursor gas source 18 provides one or more gases that include at least one material that coats the powder particles 12 during processing as will be discussed below. The material(s) from the precursor gas(es) that coats the powder particles 12 is one that, when applied in sufficient coating thickness, results in the coated powder particles 12 having a level of reflectivity that is acceptable for subsequent processing of the coated particles 12 within an additive manufacturing process. The specific thickness of the coating on the particles 12 may vary depending on factors such as the coating material, the material of the powder particle, the additive manufacturing process for which the power particles are being prepared for, etc. The present disclosure is not limited to any particular coating thickness. A precursor gas that enables the deposition of a silicon coating on the powder particles 12 is particularly useful when the present disclosure is used to coat aluminum or aluminum alloy powder particles 12. Specific non-limiting examples of a precursor gas that enables the deposition of a silicon coating on the powder particles 12 include silane ($SiH_4$), disilane ($Si_2H_6$), chlorosilane ($H_3ClSi$), dichlorosilane ($SiH_2Cl_2$), etc. The precursor gas may be used as a medium to heat the powder particles 12 (or to maintain the temperature of the powder particles 12 during processing). The precursor gas source 18 may assume any form (e.g., pressurized vessel, etc.) appropriate to provide the first precursor gas as required.

In some embodiments, the present disclosure may utilize a source 44 of one or more additional precursor gases (hereinafter referred to collectively as a source of a "second precursor gas"), each of which can be used to coat the particles 12 of the particular powder material. Examples of acceptable precursor gases that enable the deposition of a silicon coating on aluminum or aluminum alloy powder particles 12 are provided above. The source 44 of the second precursor gas may assume any form (e.g., pressurized vessel, etc.) appropriate to provide the second precursor gas as required.

The mass flow control device 20 is a standard device operable to control flow of gas within a conduit (e.g., piping 32). One or more mass control devices 20 may be used to control the delivery of working gas, first precursor gas, and second precursor gas to the reactor 14.

The liquid bubbler 24 is operable to decrease the temperature of and/or neutralize, gases introduced into the bubbler 24, such as working gases or precursor gases purged from piping upstream of the reactor 14, or working gases or precursor gases purged from the reactor 14. In the latter case, the aforesaid gases may pass through the escaped powder collector vessel 22 prior to entering the bubbler 24. The liquid disposed within the bubbler 24 may depend on the particular application at hand; e.g., water, etc.

The escaped powder collector vessel 22 is a vessel operable to collect powder particles 12 that have escaped from the reactor 14 during processing. For example, in those instances where the working gas is used as a medium to heat the powder particles 12 and is subsequently purged from the reactor 14, the purged working gas may have small amounts of powder particles 12 entrained within the purged working gas. The escaped powder collector vessel 22 is operable to collect the aforesaid powder particles 12 entrained within the purged working gas.

As indicated above, the present system 10 may be controlled, monitored, etc. using a controller having a processor 34. The processor may be adapted (e.g., programmed) to provide signals to and/or receive signals from various components disposed within the system 10 (e.g., valves 26, mass control flow devices 20, the reactor 14, flow measuring devices—e.g., pressure gauges 28, temperature sensing devices 30, etc.—, gas sources, etc.) and use such signals to control and/or monitor the system 10. The processor 34 may include one or more central processing units (CPUs) adapted (e.g., programmed) to selectively execute instructions necessary to perform the control/monitor functions described herein. The functionality of processor 34 may be implemented using hardware, software, firmware, or a combination thereof. The processor 34 may be in communication with (e.g., included with the processor) a memory 46 operable to store the aforesaid programming (e.g., instructions), which memory 46 may be non-volatile or may be in the form of non-transitory computer readable media in communication with the processor 34. A person skilled in the art would be able to adapt (e.g., program) the processor 34 to perform the functionality described herein without undue experimentation.

An exemplary method according to the present disclosure is described hereinafter to illustrate the utility of the present disclosure. The method description provided below is provided in terms of the exemplary system 10 described above. The present disclosure is not limited to the aforesaid exemplary system or the method described below.

Figure 2:
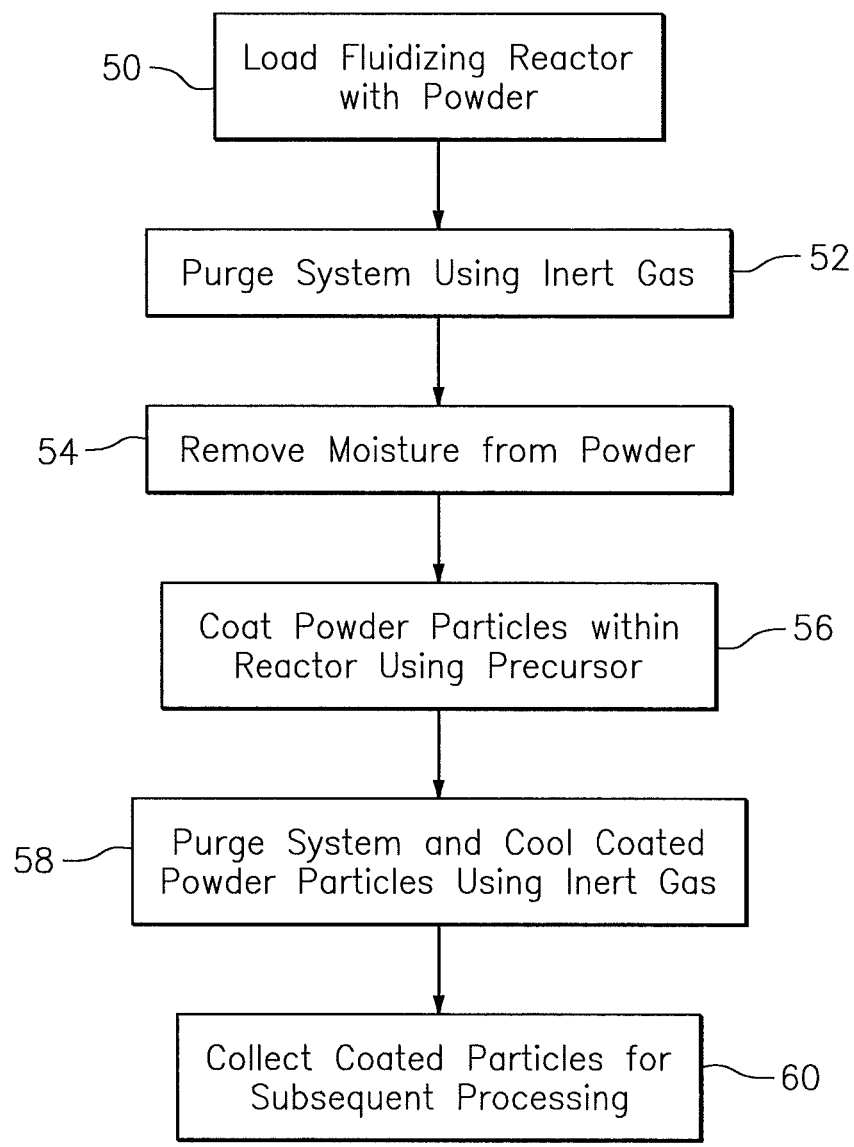
FIG. 2 is a flow chart of an embodiment of the present disclosure.

Now referring to FIG. 2, according to a method embodiment of the present disclosure an amount of powder particles 12 is introduced into the reactor 14 from a powder source (step 50); e.g., introduced into the inner reactor vessel 36. In terms of preparing a powder for subsequent use in an additive manufacturing process, non-limiting examples of acceptable aluminum alloy powders include aluminum 5056, aluminum 6061, aluminum 7075, and PANDALLOY aluminum alloy.

The system 10 is controlled to purge the reactor 14 of ambient air and provide a working gas (e.g., $N_2$) environment within the reactor vessel 36 containing the powder (step 52). The working gas may be introduced into the reactor 14 through piping 32 connecting the working gas source 16 and the reactor 14. In the embodiment shown in the schematic, the working gas enters the reactor 14 within the annular region 48 disposed between the inner vessel 36 and the outer vessel 38 via inlet 49. The system 10 is controlled to provide the working gas at a predefined mass flow using the mass flow control device 20 and valves 26. The working gas is heated prior to or after introduction into the reactor vessel using one or more heat sources 40. The powder particles 12 are "fluidized" within the reactor 14 by the working gas (i.e., suspended within the reactor 14 by the gas traveling within the reactor 14, such that the fluidized powder 12 acts like a fluid). The specific travel path of the working gas within the reactor 14 may vary depending on the configuration of the reactor 14; e.g., in the reactor embodiment shown in the schematic of FIG. 1, the working gas travels within the annular region 48 disposed between the inner vessel 36 and the outer vessel 38, enters and passes through the inner vessel 36 (via the distributor 42), and exits the reactor 14. The exiting working gas is directed through into the liquid bubbler 24 where it is cooled and/or neutralized. The temperature of the working gas within the reactor 14 is sensed and controlled using the one or more temperature sensing devices 30 (e.g., thermocouples) and the heat source 40 to provide a gas temperature sufficient to cause any moisture (e.g., water) adsorbed to the powder to be liberated from the powder and removed from reactor 14 with the exiting working gas (step 54). During this fluidization process the individual particles 12 of the powder are separated from one another, and are prevented from sintering because the particles 12 of powder are not maintained in close proximity to each other. The fluidizing of the powder particles 12 is performed at a temperature and for a period of time duration adequate to remove the adsorbed moisture; i.e., dry the powder to an acceptable moisture level.

Once the adsorbed moisture is removed from the particles, the system 10 may be controlled to purge the working gas (now containing the moisture) from the reactor 14. The present disclosure is not limited to any particular process for removing the moisture; e.g., a given volume of working gas may be maintained within the reactor 14 for a given period of time to collect the moisture and subsequently purged, or a volume of working gas may be continuously passed through the reactor 14 to collect the moisture, etc. Any powder particles 12 entrained within the purged gas may be collected in the escaped powder collector vessel 22. The system 10 is controlled to introduce a precursor gas into the reactor 14 via piping 32 at a predefined mass flow using the mass flow control device 20 and valves 26. Depending upon the application at hand, the system 10 may be controlled such that 100% of the gas entering the reactor 14 is the precursor gas, or a mixture of working gas and the precursor gas, or a mixture of one or more of working gas, a first precursor gas, or a second precursor gas. In an application wherein aluminum alloy powder is being processed for subsequent use in an additive manufacturing process, a mixture of a precursor gas (silane—$SiH_4$) and working gas (N2) may be used.

Figure 3:
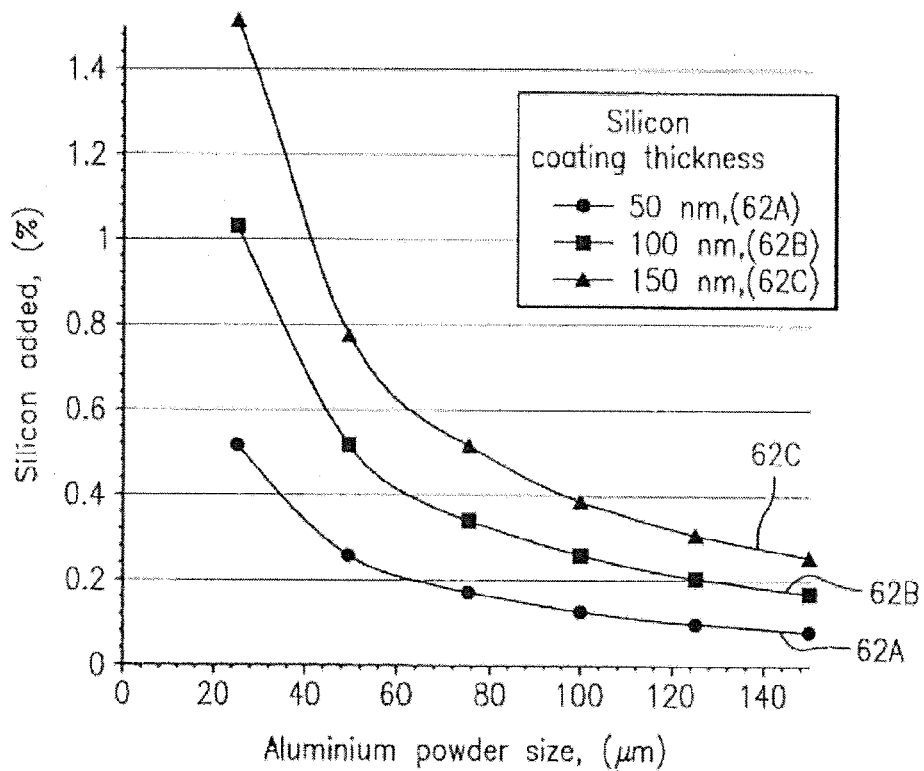
FIG. 3 is a graph of depicting a calculation of the percentage of silicon coated on a powder (Y-axis) as a function of the powder particulate size (X-axis).

Within the reactor vessel 36, the precursor gas decomposes and deposits a coating on the fluidized powder particles 12 within the vessel (step 56). A precursor gas that enables the deposition of a silicon coating on the powder particles 12 (e.g., silane) is particularly useful when processing aluminum or aluminum alloy powder particles 12 for several reasons. Silane works well as a precursor gas because it starts to decompose into silicon and hydrogen at a mild condition of 250° C. Silicon is a composition element within certain aluminum alloys (e.g., aluminum 6061 and 7075). The thickness of the particle coating can be controlled within the system 10 by varying one or more process parameters; e.g., the amount of time that the fluidized powder particles 12 are subjected to the precursor gas, the mixture ratio of the precursor ratio and working gas, etc. Consequently, the amount of silicon added to the powder via the coating process can be controlled so that the amount of silicon in the processed powder (e.g., weight % of silicon within the combined coating and unprocessed powder) is appropriate to arrive at the desired alloy composition; i.e., when the processed powder is subsequently used in an additive manufacturing process, the additively manufactured material has the desired composition percentages. Using the present disclosure, it is possible therefore to add a relatively small percentage of silicon to a powder and the powder will be a viable candidate for additive manufacturing; i.e., reflectance is not an issue. As a result, certain aluminum alloys (i.e., alloys having a low silicon content; wrought Al alloys) become additive manufacturing candidates, which alloys were not previously candidates. FIG. 3 is a graph that depicts a calculation of the percentage of silicon coated on aluminum alloy powder (Y-axis) as a function of the powder particulate size (X-axis). The curves 62A, 62B, 62C within the graph are for different silicon coating thicknesses. The thicknesses indicated in the graph are provided to illustrate the functionality of the present disclosure, and the present disclosure is not limited thereto. The calculation exhibits how the thickness of the silicon coating alters the silicon composition percentage within the alloy. Hence, the material properties of a silicon coated aluminum alloy can be maintained.

In addition, the silicon applied via a fluidizing process using silane (or other precursor gases comprising silicon) has a reflectance that is approximately less than 50% of the reflectance of aluminum at typical wavelengths used in the additive manufacturing process (e.g., wavelengths between about 400 and 1000 nanometers; 400-1000 nm). Hence, the silicon coating applied via the present disclosure substantially avoids the reflectance problem associated with additively manufacturing uncoated aluminum alloy powders. For at least these reasons, the present disclosure improves (or makes it possible to) additive manufacturing of structures using certain aluminum alloy powders.

Still further, a coating applied using the present disclosure provides an effective barrier for preventing re-adsorption of moisture onto the powder. As a result, the coated powder can be stored in a typical production environment for an extended period of time without adverse moisture adsorption.

Once the powder has been sufficiently coated in the fluidizing process, the system 10 is controlled to stop the flow of precursor gas. In many instances, the system 10 may be subsequently controlled to continue (or provide) a flow of working gas through the reactor 14. The subsequent flow of working gas is typically provided at a lower temperature. The working gas, therefore, both purges the precursor gas from the system 10 and cools the processed powder within the reactor 14 (step 58). Finally, the system 10 can be controlled to purge the cooled powder from the reactor 14, and the cooled powder can be subsequently collected from the reactor 14 (step 60) and stored in containers for subsequent processing; e.g., additive manufacturing.

The foregoing descriptions are exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A method comprising:
   disposing an amount of metallic powder particulates within a fluidizing reactor;

removing moisture adhered to the metallic powder particulates disposed within the reactor using a working gas;

coating the metallic powder particulates disposed within the reactor with a material present within a precursor gas subsequent to said removing of moisture; and purging the precursor gas from the reactor using the working gas, wherein the coating includes coating the metallic powder particulates with the material in an amount such that the coated metallic powder particulates have a level of reflectivity that is acceptable for subsequent processing of the coated metallic powder particulates within an additive manufacturing process.

2. The method of claim 1, wherein the metallic powder particulates are aluminum alloy.

3. The method of claim 2, wherein the aluminum alloy is selected from the group consisting of aluminum 5056, aluminum 6061, or aluminum 7075.

4. The method of claim 1, wherein the precursor gas comprises silicon.

5. The method of claim 4, wherein the precursor gas is selected from the group consisting of silane ($SiH_4$), disilane ($Si_2H_6$), chlorosilane ($H_3ClSi$), or dichlorosilane ($SiH_2Cl_2$).

6. The method of claim 1, wherein the removing moisture adhered to the metallic powder particulates disposed within the reactor using working gas includes heating the working gas to a predetermined temperature.

7. A method comprising:

providing a system having a fluidizing reactor, a working gas source, a precursor gas source, and a processor adapted to execute instructions to control and monitor operation of the system, wherein the processor is in communication with a memory operable to store the executable instructions;

disposing an amount of metallic powder particulates within the fluidizing reactor;

controlling the system to remove moisture adhered to the metallic powder particulates disposed within the reactor using a working gas provided from the working gas source;

controlling the system to coat the metallic powder particulates disposed within the reactor with a material present in a precursor gas provided from the precursor gas source; and controlling the system to purge the precursor gas from the reactor using the working gas, wherein the controlling the system to coat the metallic powder particulates includes coating the metallic powder particulates with the material in an amount such that the coated metallic powder particulates have a level of reflectivity that is acceptable for subsequent processing of the coated metallic powder particulates within an additive manufacturing process.

8. The method of claim 7, wherein the metallic powder particulates are aluminum alloy.

9. The method of claim 8, wherein the aluminum alloy is selected from the group consisting of aluminum 5056, aluminum 6061, or aluminum 7075.

10. The method of claim 7, wherein the precursor gas comprises silicon.

11. The method of claim 10, wherein the precursor gas is selected from the group consisting of silane ($SiH_4$), disilane ($Si_2H_6$), chlorosilane ($H_3ClSi$), or dichlorosilane ($SiH_2Cl_2$).

12. The method of claim 10, wherein the working gas is at least one of an inert gas or a reducing gas.

* * * * *